United States Patent
Bu et al.

(10) Patent No.: US 7,094,669 B2
(45) Date of Patent: Aug. 22, 2006

(54) STRUCTURE AND METHOD OF LINER AIR GAP FORMATION

(75) Inventors: Xiaomei Bu, Singapore (SG); Alex See, Singapore (SG); Tae Jong Lee, Singapore (SG); Fan Zhang, Singapore (SG); Yeon Kheng Lim, Singapore (SG); Liang Choo Hsia, Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 10/910,499

(22) Filed: Aug. 3, 2004

(65) Prior Publication Data

US 2006/0030128 A1   Feb. 9, 2006

(51) Int. Cl.
*H01L 21/46* (2006.01)
*H01L 21/78* (2006.01)
*H01L 21/301* (2006.01)
*H01L 21/76* (2006.01)
*H01L 21/4763* (2006.01)

(52) U.S. Cl. .................. 438/462; 438/319; 438/411; 438/619

(58) Field of Classification Search ............. 438/462, 438/319, 411, 521, 619
See application file for complete search history.

(56) References Cited

U.S. PATENT DOCUMENTS 6,342,722 B1 * 1/2002 Armacost et al. ......... 257/522
6,423,629 B1    7/2002 Ahn et al.
6,423,630 B1    7/2002 Catabay et al.
6,495,906 B1   12/2002 Smith et al.
6,642,138 B1   11/2003 Pan et al.
6,670,022 B1   12/2003 Wallace et al.
6,737,725 B1 * 5/2004 Grill et al. ................ 257/522
2001/0016412 A1  8/2001 Lee et al.
2002/0127844 A1  9/2002 Grill et al.
2002/0158337 A1 10/2002 Babich et al.

OTHER PUBLICATIONS

Anand, et al., Use of gas as low-k interlayer dielectric in LSI's : Demonstration of feasibility, IEEE transactions on electron device, vol. 44, No. 11, Nov. 1997, pp. 1965 to 1971.
Kohl, et al., Air Gaps for Electrical Connections, Electrochemical and solid -State letters, 1(1) pp. 49-51(1998).

* cited by examiner

*Primary Examiner*—Chuong A. Luu
(74) *Attorney, Agent, or Firm*—William J. Stoffel

(57) ABSTRACT

A structure and method of a semiconductor device with liner air gaps next to interconnects and dielectric layers. A dielectric layer is formed over a lower dielectric layer and a lower interconnect over a substrate. We form an interconnect opening in the dielectric layer. The opening has sidewalls of the dielectric layer. A sacrificial liner is formed over the sidewalls of the interconnect opening. An upper interconnect is formed that fills the opening. We remove the sacrificial liner/spacers to form (air) liner gaps.

29 Claims, 10 Drawing Sheets

STRUCTURE AND METHOD OF LINER AIR GAP FORMATION

BACKGROUND OF INVENTION

1). Field of the Invention

The embodiments of the invention relates generally to fabrication of semiconductor devices and relates to air-gap-containing metal/insulator interconnect structures for Very Large Scale Integrated (VLSI) and Ultra Large Scale Integrated (ULSI)semiconductor devices and packaging, and more particularly to structures, methods, and materials relating to the incorporation of voids, cavities or air gaps into multiple levels of multilayer interconnect structures for reducing wiring capacitance.

2). Description of the Prior Art

Copper interconnects are formed using a dual damascene process. The incorporation of low-k insulator material may be accomplished by depositing an etch stop layer and a first layer of low-k dielectric material over a copper interconnect. This may be followed by an optional etch stop barrier insulator and then a second layer of low-k material. A via is then etched through the second layer of low-k material, any etch stop barrier insulator, and the first layer of low-k dielectric material to reach the copper interconnect. A trench is then etched into the second layer of low-k material to aid in forming another layer of copper interconnects. Barrier metal and copper are deposited by sputtering, chemical vapor deposition (CVD), electrochemical deposition, or a combination of these methods. The deposited copper, and possibly the barrier metal, will then be planarized using chemical mechanical polishing (CMP) to form copper interconnects.

Air gaps have been used for intra-level insulators for copper, while using silicon oxide or low-k at the inter-level dielectric layers. The air gaps are formed by decomposing sacrificial polymer. However, prior art air gaps can be improved.

The importance of this technical subject is evidenced by the extensive technological development directed to the subject, as documented by the relevant patent and technical literature. The more relevant technical developments in the patent literature can be gleaned by considering the following.

US 20020158337 A1—Babich, et al.—Multilayer interconnect structure containing air gaps and method for making—an air-gap-containing interconnect wiring structure is described incorporating a solid low-k dielectric in the via levels, and a composite solid plus air-gap dielectric in the wiring levels.

US 20010016412 A1—Lee, Ellis; et al. Interconnect structure with air gap compatible with unlanded vias.

US 20020127844 A1—Grill et al.—Multilevel interconnect structure containing air gaps and method for making.

U.S. Pat. No. 6,495,906 Smith, et al.—Simplified process for producing nanoporous silica—relates to low dielectric constant nanoporous silica films and to processes for their manufacture. A substrate, e.g., a wafer suitable for the production of an integrated circuit, having a plurality of raised lines and/or electronic elements present on its surface, is provided with a relatively high porosity, low dielectric constant, silicon-containing polymer film composition.

U.S. Pat. No. 6,670,022 Wallace, et al.—Nanoporous dielectric films with graded density and process for making such films—relates to nanoporous dielectric films and to a process for their manufacture. A substrate having a plurality of raised lines on its surface is provided with a relatively high porosity, low dielectric constant, silicon containing polymer composition positioned between the raised lines and a relatively low porosity, high dielectric constant, silicon containing composition positioned on the lines.

U.S. Pat. No. 6,423,630 Catabay, et al.—Process for forming low K dielectric material between metal lines—A process is disclosed for forming low k dielectric material between and over a plurality of spaced apart metal lines previously formed over a dielectric layer of an integrated circuit structure.

U.S. Pat. No. 6,642,138 Pan, et al.—Process of making dual damascene structures using a sacrificial polymer—A method is provided to deposit and pattern a sacrificial polymer, and form metal layers. A double hard mask is used to pattern and etch the sacrificial polymer. The double hard mask may be formed at temperatures below 400.degree. C. The sacrificial polymer is capable of being decomposed to become air gaps during annealing.

U.S. Pat. No. 6,342,722 Armacost, et al.—Integrated circuit having air gaps between dielectric and conducting lines.

U.S. Pat. No. 6,423,629—Ahn, et al.—Multilevel copper interconnects with low-k dielectrics and air gaps.

SUMMARY OF THE INVENTION

The embodiments of the present invention provides a structure and method of a semiconductor device with liner air gaps next to interconnects and dielectric layers.

An example method embodiment comprises forming a dielectric layer over a lower dielectric layer and a lower interconnect over a substrate. We form an interconnect opening in the dielectric layer. The opening has sidewalls of the dielectric layer. A sacrificial liner is formed over the sidewalls of the interconnect opening. An upper interconnect is formed that fills the opening. At some point in the process, we remove the sacrificial spacers to form air liner gaps.

There are three example options for the process to form the sacrificial liners.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference.

DETAILED DESCRIPTION OF THE PREFERRED EMBODIMENTS

I. Overview

The example embodiments of the present invention will be described in detail with reference to the accompanying drawings. The example embodiments of the present invention provide structure and a method of forming a liner air gaps for interconnects.

Embodiments show an integration scheme to form liner air gaps adjacent to and/or surrounding metal lines and vias. The presence of liner air gaps can significantly reduce the effective intra-metal dielectric constant.

Note, the description and claims may describe layers and interconnects as first, second, (e.g., levels) etc., but these are relative terms and layers or interconnect can be formed at any level.

An example embodiment for fabrication of liner gap in a semiconductor device is described below. There are three preferred non-limiting options to form the sacrificial lines. (See FIGS. 1H, 1I, 1J ($1^{st}$ option), FIGS. 2A–2C($2^{nd}$ option), FIGS. 3A–3C($3^{rd}$ option).)

Form an ILD Layer

Figure 1A:
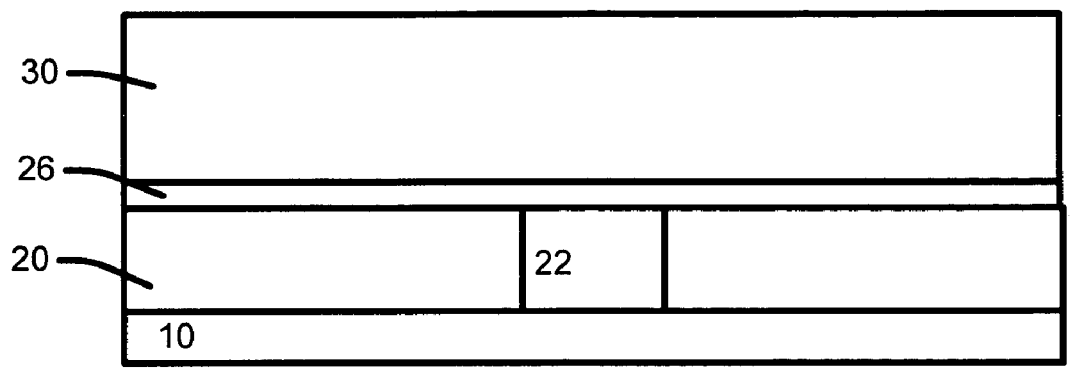
FIGS. 1A thru 1L are cross sectional drawings for illustrating an example embodiment for forming a line air gap of the present invention.

Referring to FIG. 1A, we form an interlevel dielectric layer 20 over a substrate 10.

The substrate can includes a semiconductor substrate and may include one or more additional layers, such as epitaxial layers, isolation, (SOI) layers and the like, formed on the substrate. Further, the substrate is illustrated as a single layer to simplify the drawings and explanation, since all such additional layers are not relevant to this invention.

The interlevel dielectric (ILD) layer is preferably formed of an low K material, oxide or other dielectric material.

Form a Lower Interconnect

Next, we form a lower interconnect 22 in the ILD layer. The lower interconnect can be a W plug contacting the substrate surface.

Form a ILD Cap Layer

We then form an interlevel dielectric cap layer 26 over the interlevel dielectric layer 20. The cap layer is preferably comprised of SiN or SiC. The cap layer preferably has thickness between 200 and 1000 Å. A purpose of the cap layer is to act as an etch stop and Cu diffusion barrier.

Form an IMD1 Layer

We form an inter metal dielectric 1 (IMD1) layer 30 over the ILD cap layer 26. The inter metal dielectric layer laterally separates interconnects on the same level. The inter metal dielectric is not a liner layer. The inter level dielectric layer is preferably comprised of a low k material such as SiLK™ or Coral™ or MSQ or other low-k materials. The inter metal dielectric preferably has a thickness between 2000 and 5000 Å.

Form a M1 Trench Through the IMD1 Layer

Figure 1B:
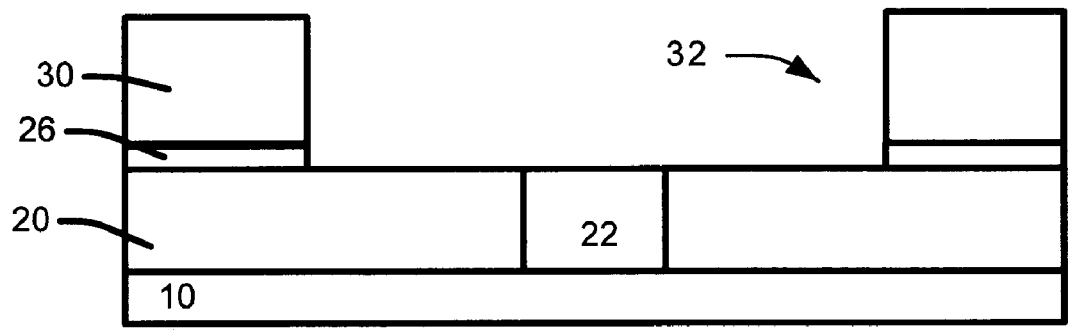

Referring to FIG. 1B, we form a M1 trench (opening) 32 through the IMD1 layer 30 over the ILD cap layer 26 to expose the ILD layer 20 and plug 22. The M1 trench 32 has sidewalls on the M1 IMD1 layer 30.

Form a M1 Sacrificial Liner

Figure 1C:
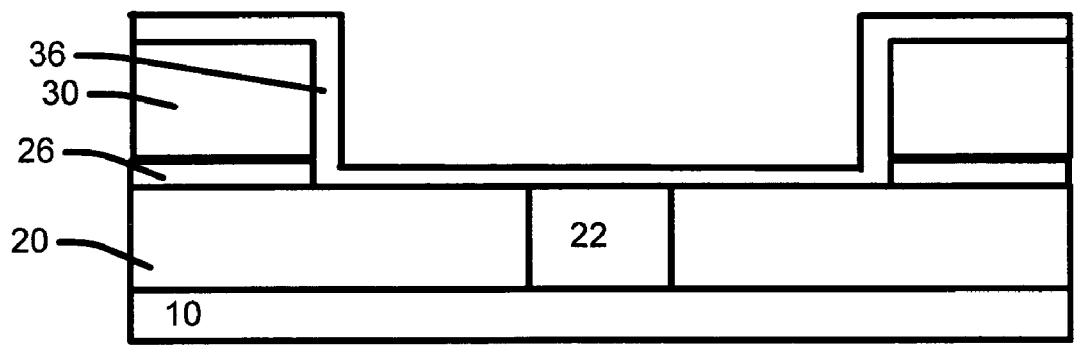
Figure 1D:
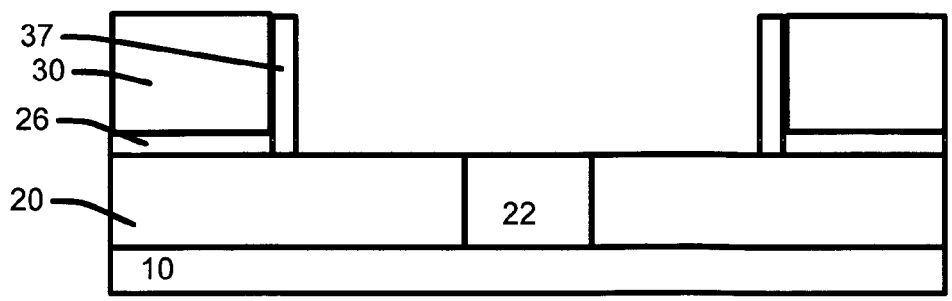

Referring to FIG. 1D, we form a M1 sacrificial liner 37 over at least the sidewalls of the M1 trench. The sacrificial liner can be preferably formed any one of the three options (discussed further below).

In a first option process shown in FIG. 1C and FIG. 1D (option 1), the sacrificial liner 37 is formed by 1) forming a sacrificial layer 36 over the trench; and 2) anisotropically etching the sacrificial layer 36 to form the sacrificial liner 37. The sacrificial layer can be the pore sealing material for porous ultra-low k. The sacrificial layer can be decomposed after deposition of next IMD layer to form a liner air gap.

The second and third options for the sacrificial liner layer are described further below.

Form a First Level Interconnect Filling the Trench

Figure 1E:
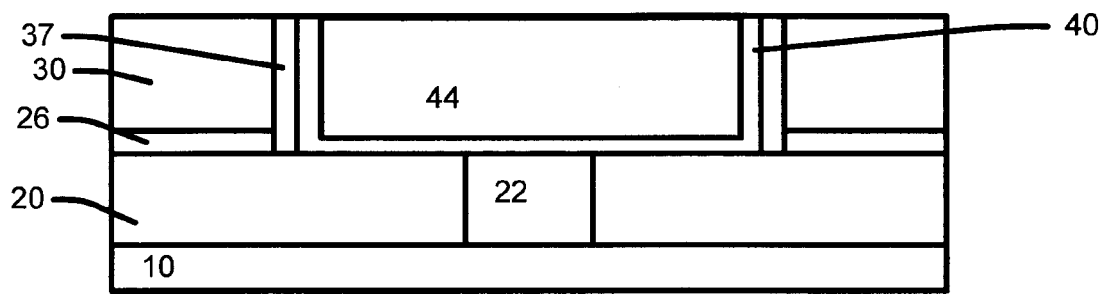

Referring to FIG. 1E, we form a first (level) interconnect 44 40 filling the trench 32.

The first level interconnect 44 40 can be comprised of a liner 40 and a metal first level interconnect 40. The liner is preferably comprised of Ta or Ti, TiN or other materials. The liner preferably has a thickness between 50 and 400 Å. The liner 40 is not formed of a sacrificial material.

The metal first level interconnect 44 is preferably comprised of copper or other conductive materials. The metal first level interconnect 44 is preferably formed by a deposition or ECP and CMP planarization process.

Optional Removal of Sacrificial Layer

In an optional step, the sacrificial material can be removed at this point in the process. The sacrificial material can be removed at other points in the process.

Figure 1F:
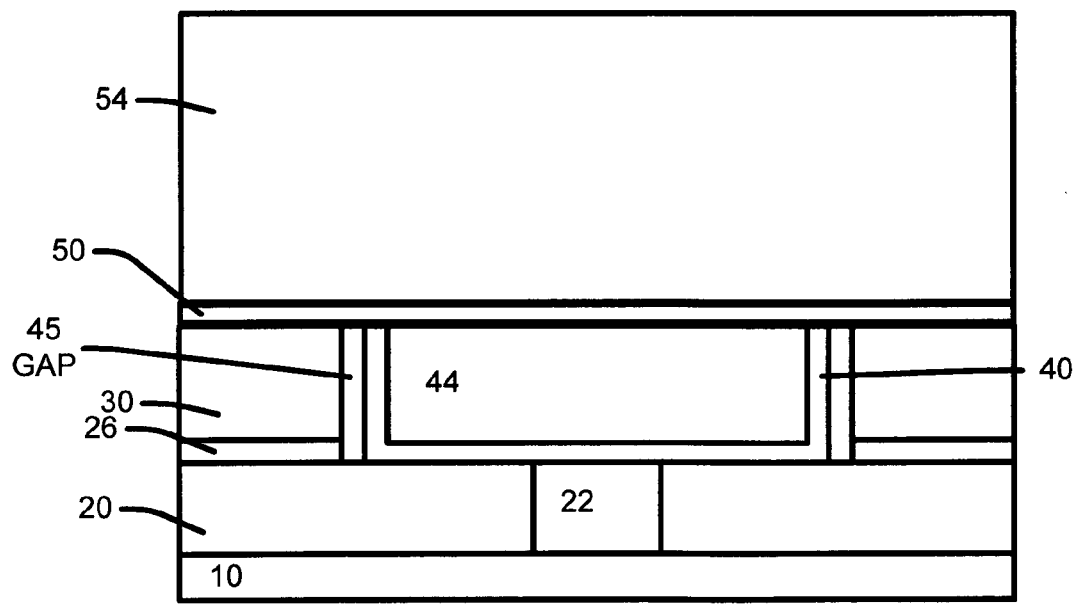

FIG. 1F shows the liner air gap 45 formed after the sacrificial liners 37 are removed.

Form a IMD1 Cap Layer Over the First Level Interconnect

As shown in FIG. 1F, we form a IMD1 cap layer 50 over the first level interconnect 44 40. The IMD1 cap layer 50 can be comprised of silicon nitride or SiC and preferably has a thickness between 200 and 1000 angstroms.

Form a Dielectric Layer

Subsequently, we form a (e.g., IMD2) dielectric layer 54 over the IMD1 cap layer 50 and IMD1 layer 30. The inter metal dielectric is preferably comprised of a low K material (K<3) carbon-doped siloxanes (OSGs), such as Silk™ from Dow Chemical (Midland, Mich.), or Coral™ Novellus and preferably has a thickness between 4000 and 10,000 Å.

Form an Opening in the IMD2 Dielectric Layer

Figure 1G:
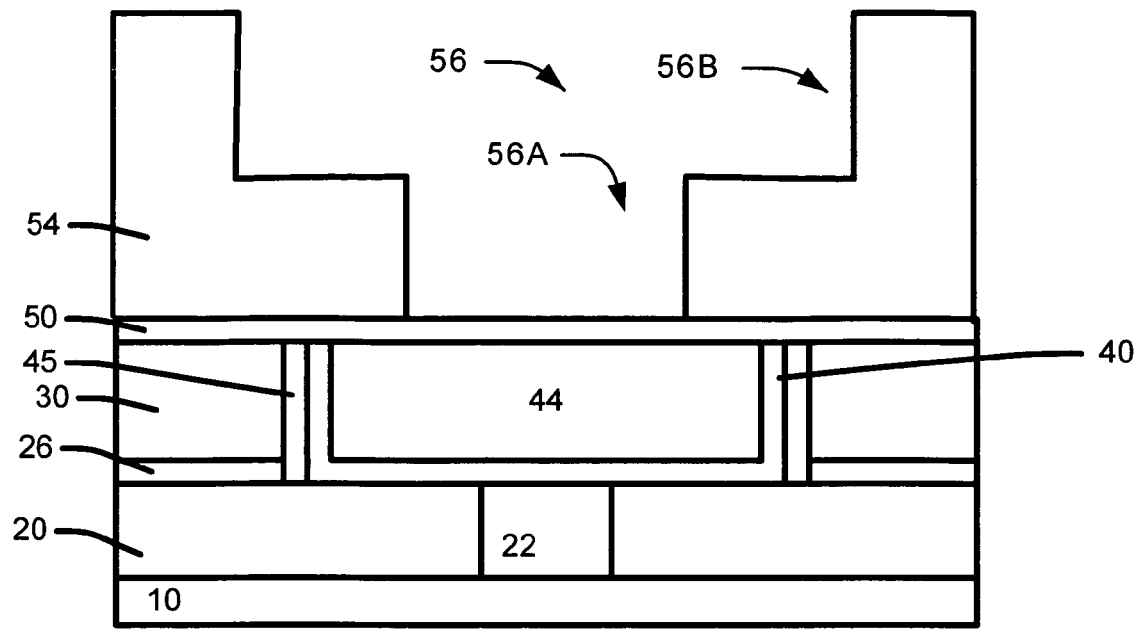

As shown in FIG. 1G, we form an interconnect opening 56 in the IMD2 dielectric layer 54 to expose the IMD1 cap layer 50.

The opening preferably has a dual damascene shape with a via trench opening 56A and a line trench opening 56B.

Form a Sacrificial Liner Over the Sidewalls of the Opening

Figure 1H:
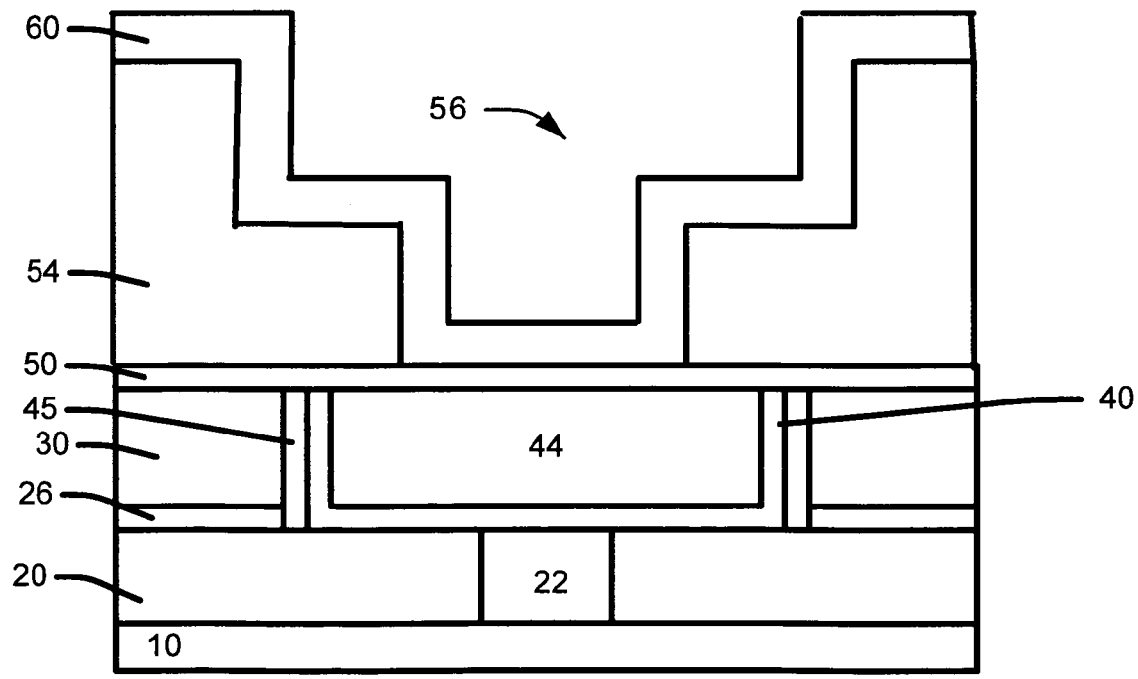
Figure 1I:
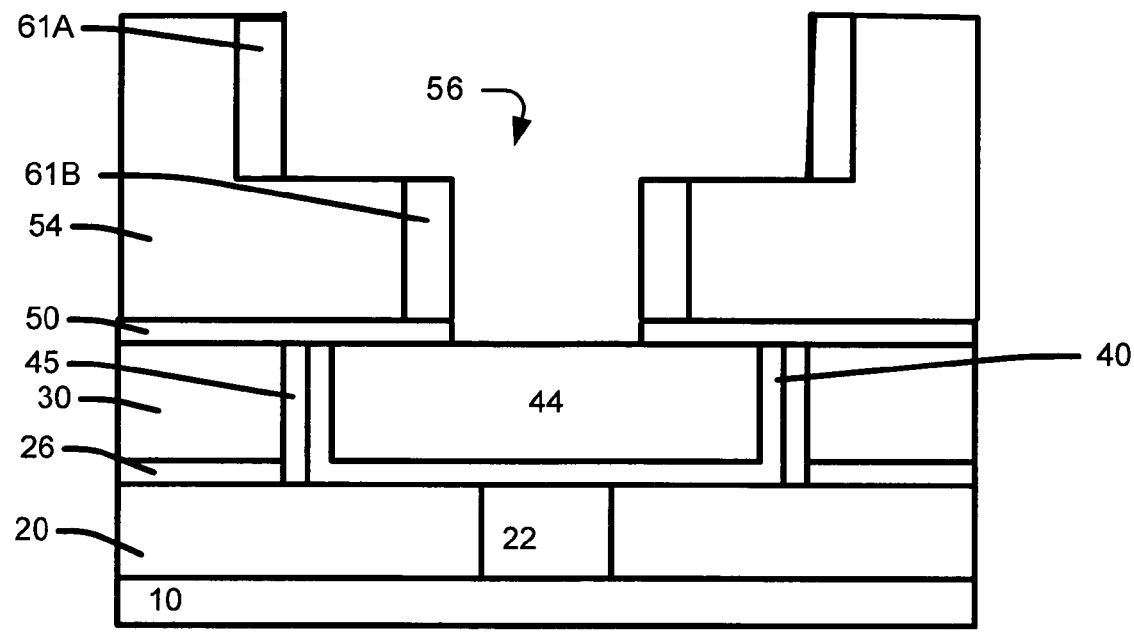

As shown in FIGS. 1H and 1I (and FIGS. 2C and 3C), we form a sacrificial liner over the sidewalls of the opening. Preferably, at least a portion of the sidewalls are about vertical.

The sacrificial liner is distinct from a IMD or ILD layer. The sacrificial differs from the inter metal dielectric (IMD) layer at least because the sacrificial liner has a property that allows the liner to be removed or decomposed in a subsequent step. Also optionally, the sacrificial liner substantially smaller horizontal width than the IMD or ILD layer. Liner layer typically follow the shape of the interconnect or the interconnect opening in the dielectric layer. Interconnect openings are typically formed in the ILD and IMD layer, not in the liner layers. Compared to liner layers, IMD layers or air gaps typically occupy a majority of the horizontal space between interconnects on a level.

There are 3 preferred options for forming the sacrificial liner.

Option 1—FIGS. 1H and 1I

In a first option, (dep sac layer, aniso etch) See FIG. 1I, the sacrificial liner 61A 61B is formed by (a) (See FIG. 1H) forming a sacrificial layer 60 over the opening.

Then we (b) anisotropically etch the sacrificial layer and the cap layer 50 to form sacrificial spacers 61A 61B on the sidewalls of the opening and expose the first level interconnect 44 40.

An advantage of Option 1, is that there is no copper exposure to air after the decomposition of sacrificial materials.

For a dual damascene shaped opening, the sacrificial spacers preferably comprised of via trench spacers 61A and line trench spaces 61B.

Figure 2A:
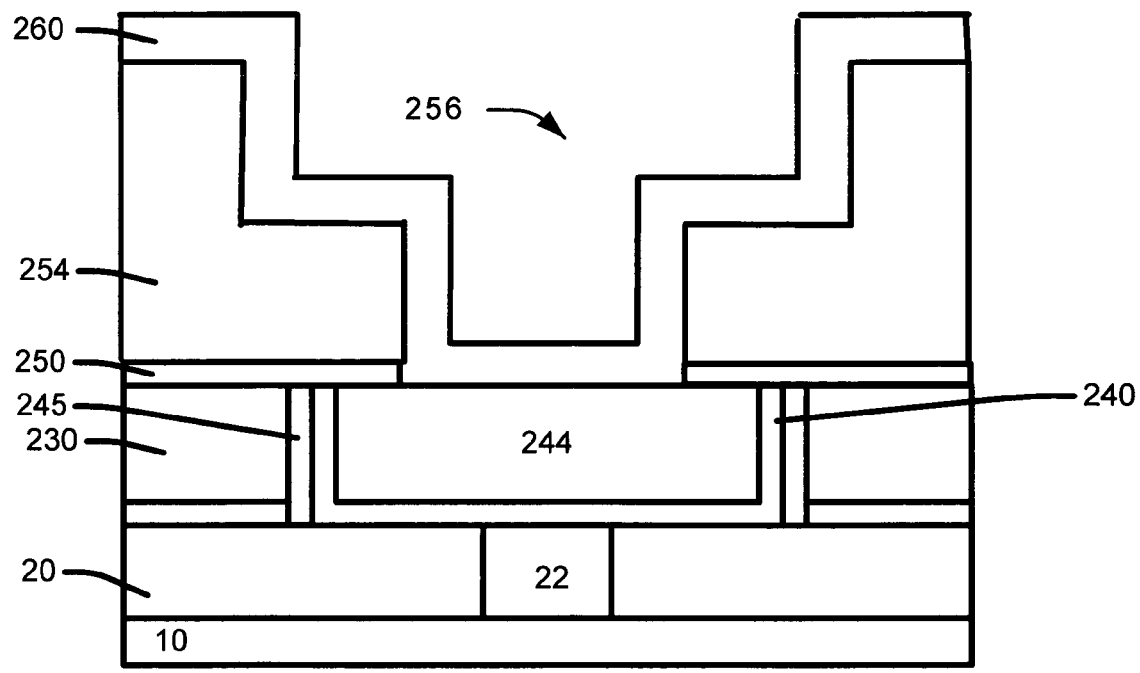
FIGS. 2A, 2B and 2C are cross sectional drawings for illustrating an second example embodiment for forming the sacrificial liner of the present invention.
Figure 2B:
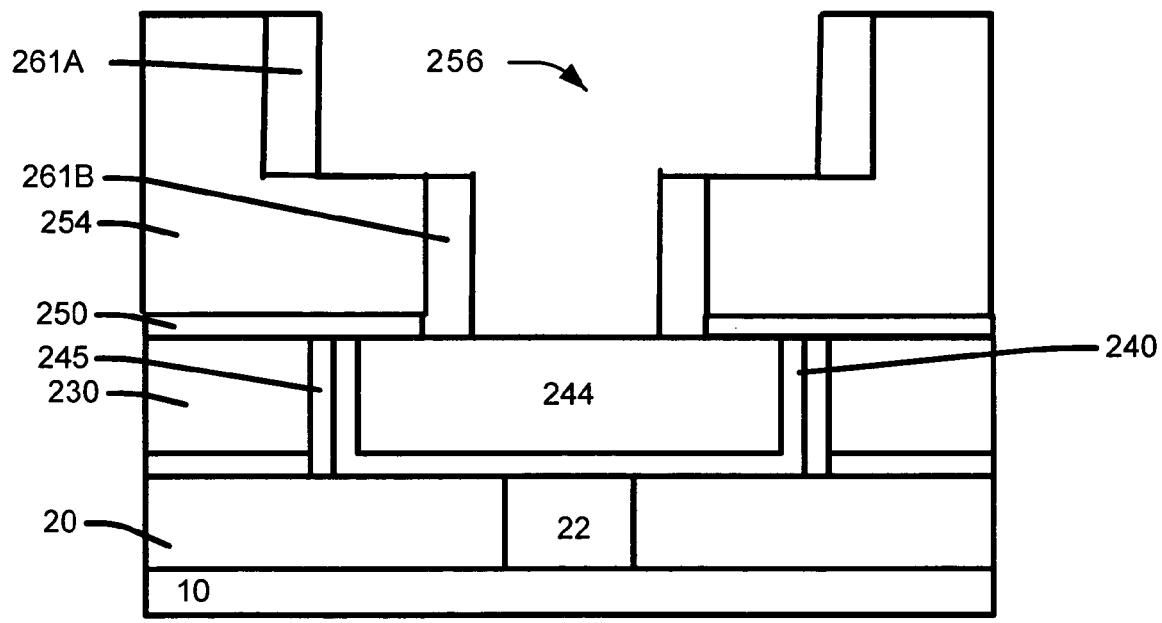
Figure 2C:
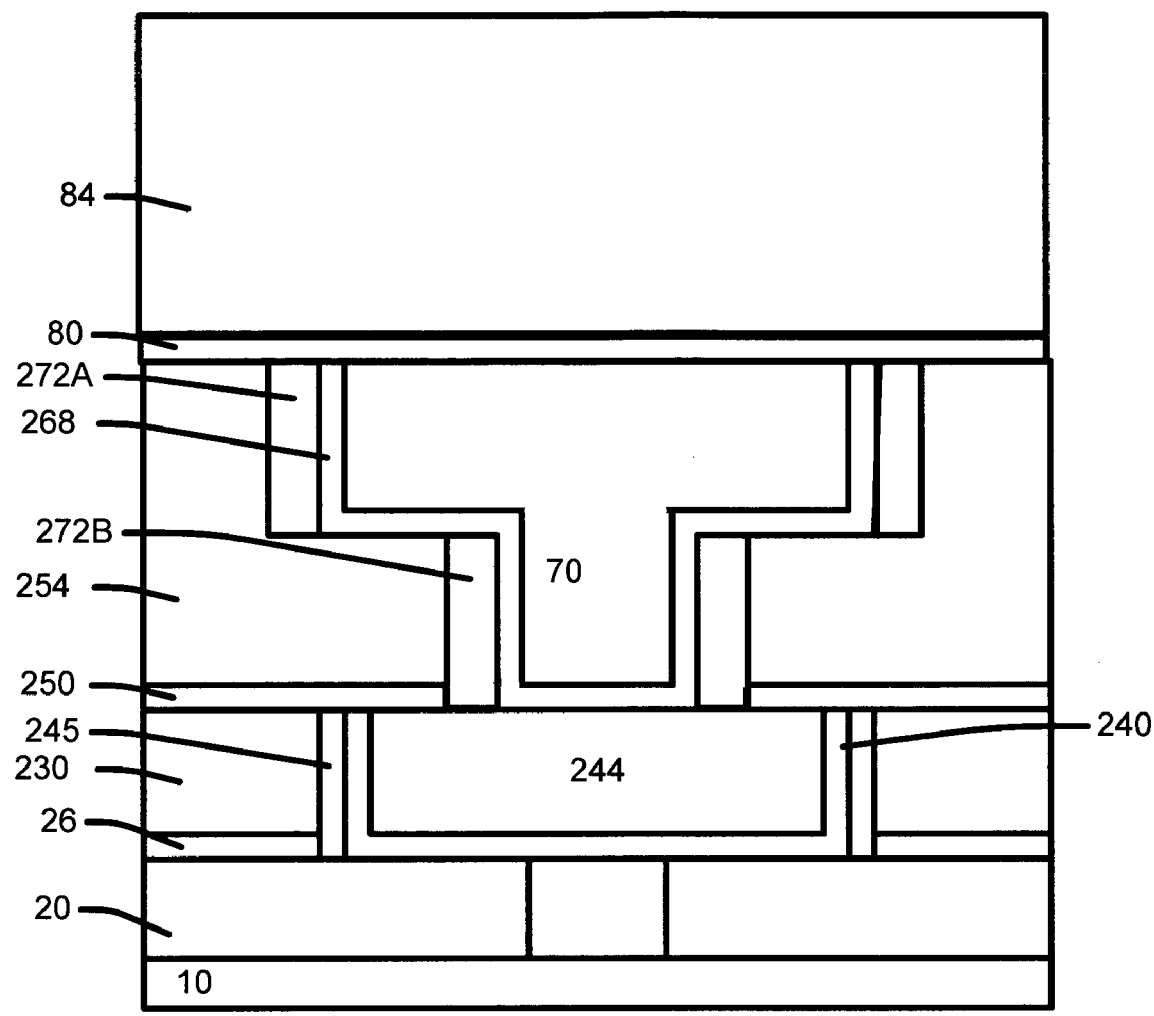

Option 2—FIGS. 2A, 2B and 2C

In the option 2, the sacrificial liner 261A 261B is preferably formed by (a) etching the cap layer 250 in the opening 256 in the IMD layer 254 to expose the first (level) interconnect 240 244.

Then we (b) form a sacrificial layer 260 over the opening.

Referring to FIG. 2B, we (c) anisotropically etch the sacrificial layer 260 to form sacrificial spacers/liners 261A 261B on the sidewalls of the opening and expose the first (level) interconnect 240 (liner 244).

FIG. 2C, shows an interconnect 70 and liner (e.g., barrier layer) 268 formed. A cap layer 80 and IMD layer 84 are formed.

The sacrificial spacers/liners 261A 261B are removed to form spacer gaps 272A 272B.

Figure 3A:
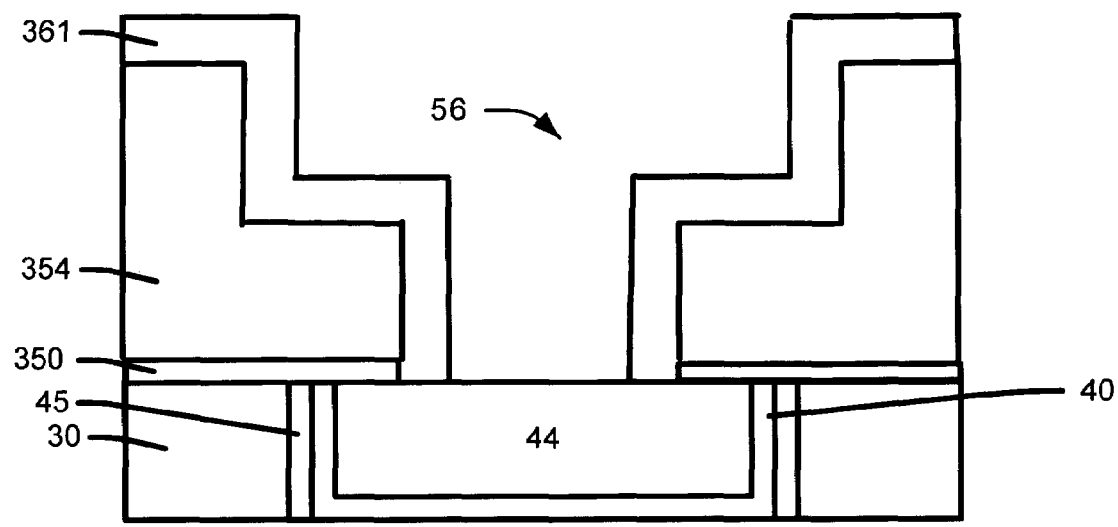
FIGS. 3A, 3B and 3C are cross sectional drawings for illustrating an third example embodiment for forming the sacrificial liner of the present invention.
Figure 3B:
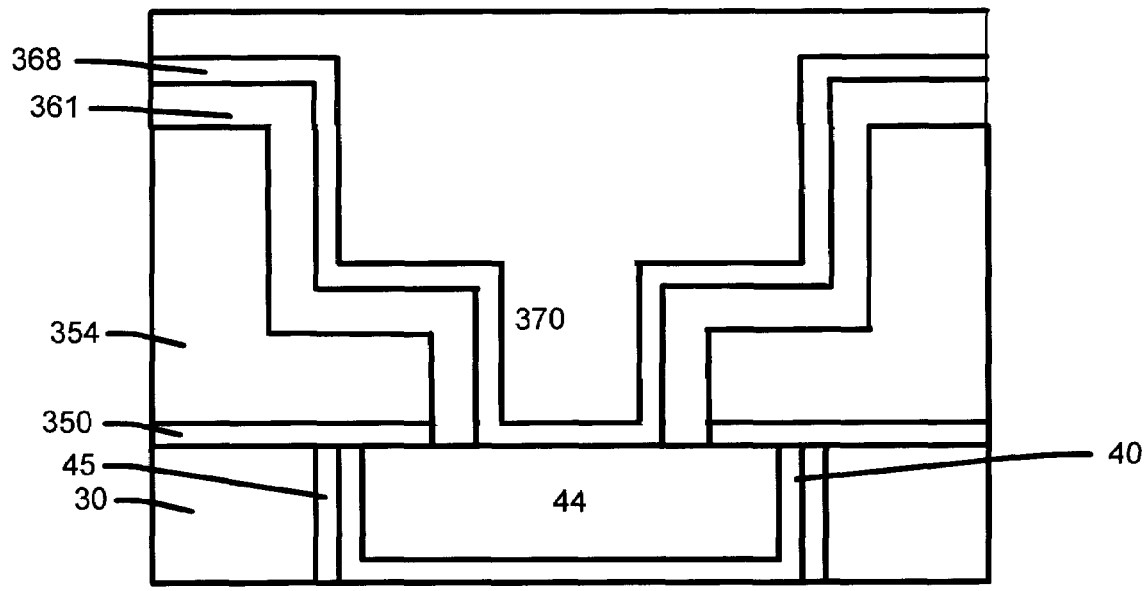
Figure 3C:
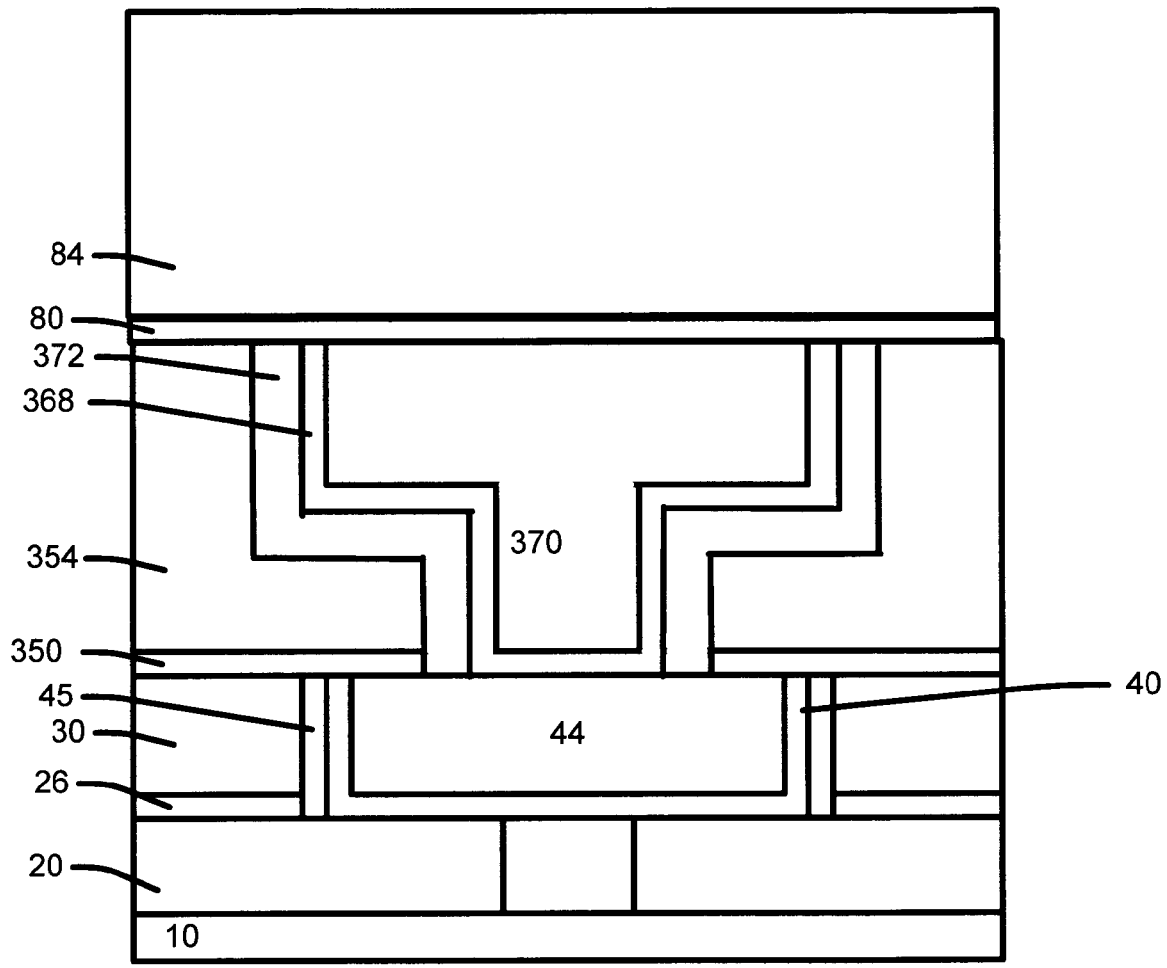

Option 3—FIGS. 3A, 3B, and 3C

In a third option, (selective sac layer depo) referring to FIGS. 3A and 3B and 3C, the sacrificial liner 361 is formed by (a) etching the cap layer 350 to expose the first (level) interconnect 44. Then we (b) form a sacrificial layer 361 using a selective deposition over the cap layer 350 and the IMD2 dielectric layer 354, but not on the first (level) interconnect 44.

For example, referring to FIG. 3A, we form the sacrificial layer 361 over the dielectric layer(s) (not over the conductive interconnect 44) using a selective deposition process.

As shown in FIG. 3B, a liner layer 368 and a metal layer 370 are deposited thereover.

As shown in FIG. 3C, the sacrificial layer 361, liner layer 368 and metal layer 370 are planarized (preferably by chemical-mechanical polish (CMP)).

A cap layer 80 and dielectric layer 84 are formed thereover.

The sacrificial layer 361 is removed to from spacer gaps 372. The sacrificial layer 361 can be removed at any point in the process.

Composition of the Sacrificial Layer

For cases were the IMD layer is formed of a low k material that has pores, such as Silk™ from Dow Chemical (Midland, Mich.), Black Diamond by Applied materials and Coral™ by Novellus, the sacrificial liner is preferably comprised of pore sealing material, such as Parylene-N, Orion or MSQ.

Compositions of the Sacrificial Layer for Different Removal Methods

The sacrificial liner can be comprised of a material that can be removed by a heat treatment, light treatment, or e-beam or chemical reaction.

The sacrificial liner can be comprised of carbon which preferably requires oxidation at 450 C. For examples of carbon materials, see Anand, et al., Use of gas as low-k interlayer dielectric in LSI's : Demonstration of feasibility, IEEE transactions on electron device, Vol. 44, no. 11, November 1997, pp. 1965 to 1971.

The sacrificial liner can be comprised of functionalized polynorbornene which decompose at 425° C. or above. For example, see Kohl, et al., Air Gaps for Electrical Connections, Electrochemical and solid-State letters, 1(1) pp. 49–51 (1998).

Other examples of sacrificial materials and removal methods include poly (methylmethacrylate) (PMMA) and parylene (e.g., poly-para-xylylene sold under the trademark "Paralylene")which may be removed by organic solvents, oxygen ashing, and/or low temperature (.about.200.degree. C.) oxidation, and norbornene-based materials such as BF Goodrich's Unity Sacrificial Polymers.™, which may be removed by low temperature (350–400.degree. C.) thermal decomposition into volatiles. In the case of Unity™, the volatiles actually diffuse through the bridge layer. Diffusion through a bridge layer was demonstrated by Kohl et al. for structures comprising $SiO_2$ (500 nm) bridge layers deposited by low temperature PECVD.

Form a Second Level Interconnect

Figure 1J:
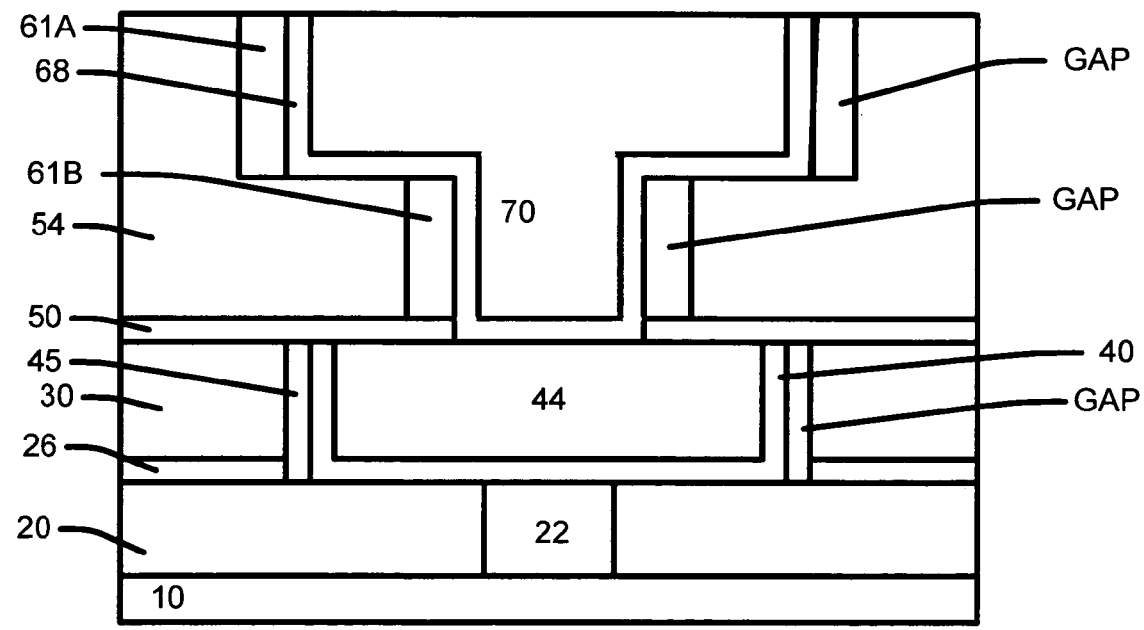

Referring to FIG. 1J, we form a second level interconnect 70 68 filling the opening 56. The second level interconnect 70 68 is preferably comprised of a metal liner (e.g., Ta, Ti or TaN, Ru, Ru oxide) 68 and a metal second level interconnect 70.

The metal liner is preferably a Ta layer formed by PVD. That can be followed by a Cu seed layer depositions with PVD followed by ECP Cu and anneal and CMP.

Preferably a Cu seed layer is then deposited with PVD.

Next, metal second level interconnect 70 is preferably formed by ECP Cu.

Then the interconnect is annealed and preferably planarized by chemical-mechanical polish (CMP).

Form an IMD2 Cap Layer

Figure 1K:
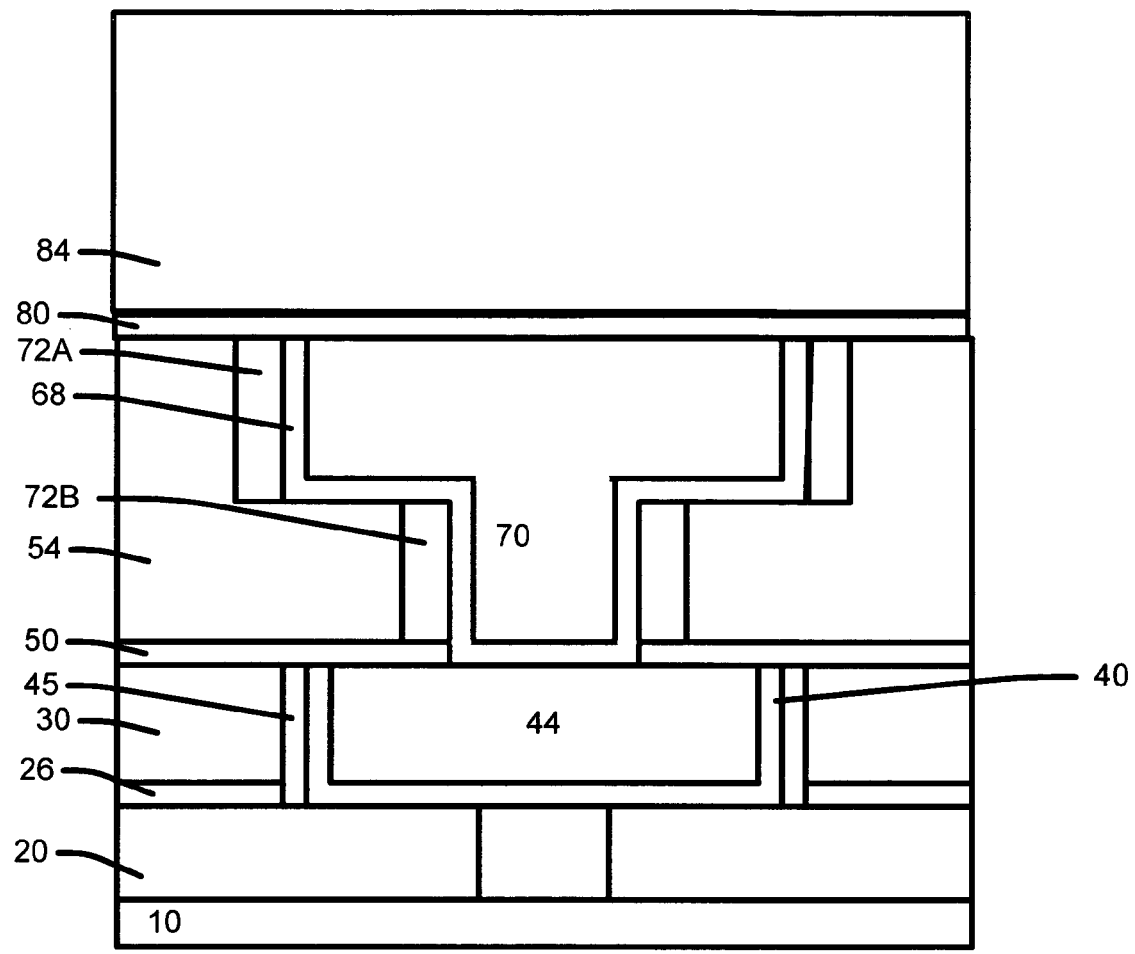

Referring to FIG. 1K—forming an IMD2 cap layer 80 over the second level interconnect 70 68 and the IMD2 layer 54.

Form a IMD3 Layer

Referring to FIG. 1K, we form a IMD3 layer 84 over the IMD2 cap layer 80.

Remove the Sacrificial Spacers to Form Air Liner Gaps

We remove the sacrificial liners/spacers 37 61A 61B to form air liner gaps 72A 72B; and if present, remove the sacrificial spacers 37 to form air liner gaps 45.

The sacrificial material can be removed by many processes such as: heat treatment (e.g., decomposition), light treatment (e.g., electromagnetic radiation, decomposition), e-beam chemical reaction or selective etch (e.g., for single damascene structure).

Form Additional Levels

Figure 1L:
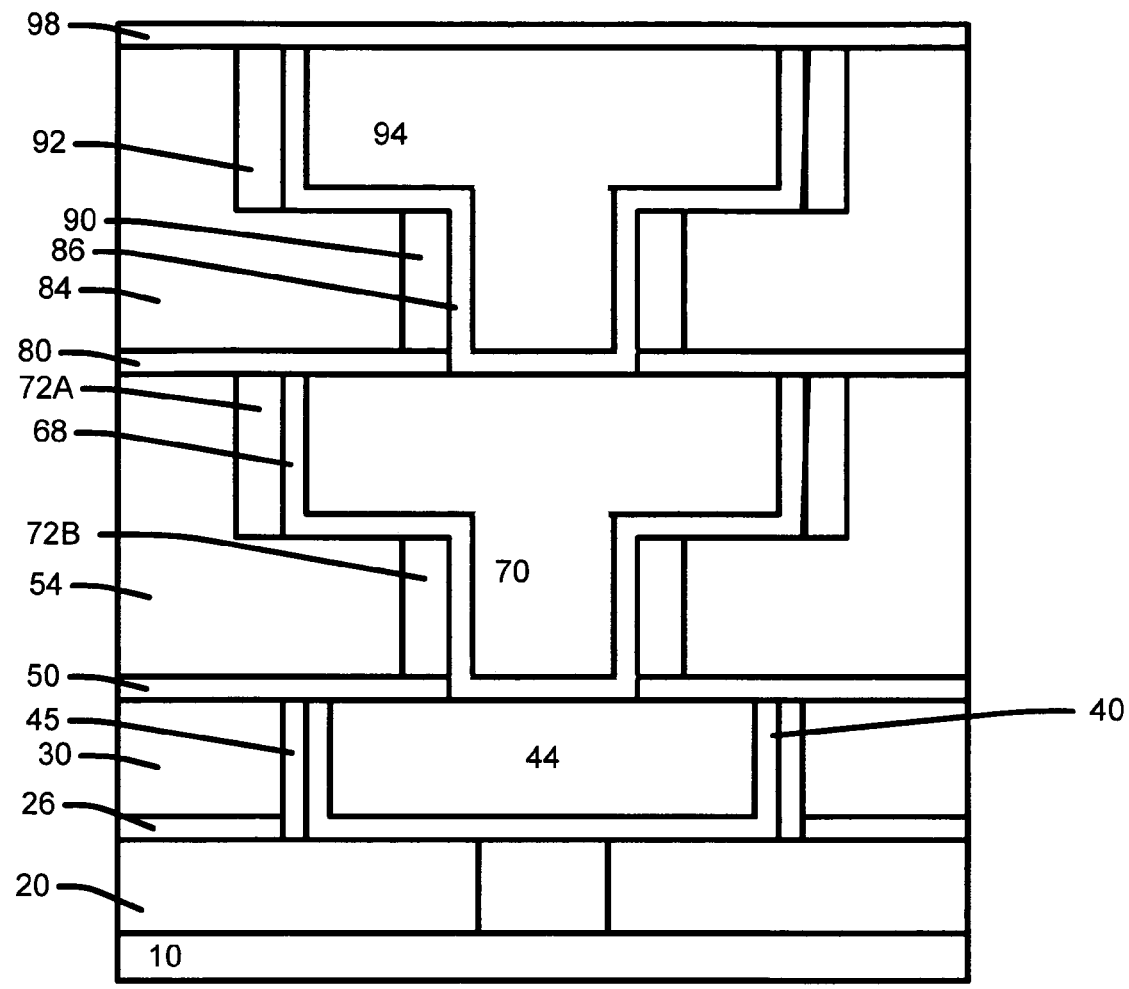

Referring to FIG. 1L, another level of interconnect with spacer gaps 90 92 are formed. FIG. 1L shows a cap layer 80, liner 86, interconnect 94, spacer gaps 92 90, dielectric layer 84 and cap layer 98. The spacer gaps 92 90 can be formed using any of the options described above.

Additional levels of interconnect and liner air gaps can be formed.

The sacrificial liner is distinct from a IMD or ILD layer. The sacrificial differs from the inter metal dielectric (IMD) layer at least because the sacrificial layer can be removed or decomposed selectively with respect to the ILD and IMD layers. Also optionally, the sacrificial liner has a substantially smaller horizontal width than the ILD and IMD layers. Liner layer typically follow the shape of the interconnect opening in the dielectric layer. Interconnect opens are typically formed in the ILD and IMD layer, not in the liner layers. IMD layers typically occupy a majority of the horizontal spacer between interconnect on a level.

The embodiment's sacrificial liner layer typically has a thickness between 100 and 1000 Å. This contrasts with the inter metal dielectric layer (minimum design rule) horizontal thickness that can range between 0.06 and 0.35 µ. For example in a 0.13 µm ground rule product, the sacrificial liner would preferably have a horizontal thickness between 100 and 800 Å. In a 0.13 µm ground rule product, the minimum distance between interconnect would between about 0.18 and 0.22 µm. The inter metal dielectric layer would fill substantially all the horizontal distance between the interconnects. The interconnect typically has a horizontal width between 0.01 and 0.2 µm. The line air gap ratio can be 100% in the minimum design rule, but between 0 and 100% in other areas.

The embodiment's liner air gap has the following non-limiting advantages:

The liner air gap structure should have much better reliability performance compared to complete air gap structure.

The intra-metal dielectric constant and the reliability performance can be balanced by running the liner air gap proportion in IMD or by choosing different IMD materials with different E values and mechanical properties.

The liner air gap structure should tolerate more mechanical stress applied during processes, such as CMP so that higher level metals can be built.

The advantages of some of the example embodiments include some of the following advantages:

Liner air gaps can effectively reduce the intra-metal dielectric constant, and hence RC delay and cross-talk etc.

The liner air gap structure should have much better reliability performance compared to complete air gap structure.

With dielectric support, higher level metal structure can be built.

With the shrinking of devices, copper interconnect is needed to apply low k as IMD materials to minimize the RC delay, cross talk, and power dissipation. Formation of air gap in the BEOL interconnect is the ultimate solution of minimizing RC delay. However, there are many issues (especially reliability issues) associated with complete air gap (forming air gap in between metal lines) copper interconnects.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of liner gap in a semiconductor device; comprising the steps of:
   a) forming a dielectric layer over a substrate; then
   b) forming an opening in said dielectric layer; said opening has sidewalls of said dielectric layer; then
   c) forming a sacrificial liner over the sidewalls of said opening; then
   d) forming an upper interconnect filling said opening; and then
   e) removing said sacrificial liner to form air liner gaps.

2. The method of claim 1 wherein before the step of removing said sacrificial liner, which further includes forming a cap layer over said upper interconnect and said dielectric layer.

3. The method of claim 1 wherein said opening has a dual damascene shape with a via trench and a line trench; said upper interconnect is comprised of a metal liner and a metal upper interconnect; said opening exposes a lower interconnect.

4. The method of claim 1 wherein said sacrificial liner is formed by (a) forming a sacrificial layer over said opening, and (b) anisotropically etching said sacrificial layer to form sacrificial liners on the sidewalls of said opening and expose a lower interconnect.

5. The method of claim 1 wherein said sacrificial liner is formed by (a) forming a sacrificial layer over said opening, and (b) anisotropically etching said sacrificial layer to form sacrificial liners on the sidewalls of said opening and expose a lower interconnect; and said sacrificial liner is comprised of via trench spacers and line trench spacers.

6. The method of claim 1 which further includes before step (a):
   forming a lower dielectric layer and a lower interconnect over said substrate;
   forming a lower cap layer on said lower dielectric layer; and
   said opening is formed by etching said dielectric layer and said lower cap layer to expose said lower interconnect, and forming a sacrificial layer over said opening, and
anisotropically etching said sacrificial layer and said lower cap layer to form sacrificial liners on the sidewalls of said opening and exposing said lower interconnect.

7. The method of claim 1 wherein said sacrificial liner is formed by forming a sacrificial layer using a selective deposition over said dielectric layer.

8. The method of claim 1 wherein said sacrificial liner comprised of pore sealing material.

9. The method of claim 1 wherein said sacrificial liner is comprised of a material that can be removed by a heat treatment, light treatment, e-beam, or chemical reaction.

10. The method of claim 1 wherein said sacrificial liner is comprised of carbon.

11. The method of claim 1 wherein said sacrificial liner is comprised of functionalized polynorbornene.

12. The method of claim 1 wherein said upper interconnect comprised of a barrier liner and a metal upper interconnect.

13. The method of claim 1 wherein said air liner gaps have a width between 100 and 1000 Å and the minimum horizontal distance between said upper interconnect and an adjacent upper interconnect on the same level is between about 0.06 and 0.35 µm.

14. The method of claim 1 wherein said upper interconnect has a horizontal width between 0.01 and 0.2 µm.

15. A method of fabrication of liner gap in a semiconductor device; comprising the steps of:
   a) forming a first IMD layer over a structure; then
   b) forming a trench through said first IMD layer to expose the top surface of said structure; said trench having sidewalls on said first IMD layer; then
   c) forming a first sacrificial liner over at least the sidewalls of said wench; then
   d) forming a first interconnect filling said trench; then
   e) forming a first IMD cap layer over said first interconnect; then
   f) forming a second IMD dielectric layer over said first IMD cap layer and first IMD layer; then
   g) forming an opening in said second IMD dielectric layer to expose said first IMD cap layer; then
   h) forming a sacrificial liner over the sidewalls of said opening; then
   i) forming a second interconnect filling said opening; then
   j) forming a second IMD cap layer over said second interconnect and said second IMD layer;
   k) forming a third IMD layer over said second IMD cap layer;
   l) removing said sacrificial liner to form air liner gaps.

16. The method of claim 15 wherein said opening has a dual damascene shape with a via trench and a line trench; said first level interconnect is comprised of a liner and a metal first level interconnect; and said second interconnect is comprised of a metal liner and a metal second interconnect.

17. The method of claim 15 wherein said sacrificial liner is formed by 1) forming a sacrificial layer over the trench; and 2) anisotropically etching said sacrificial layer to form said sacrificial liner.

18. The method of claim 15 wherein said sacrificial liner is formed by (a) forming a sacrificial layer over said opening, and (b) anisotropically etching said sacrificial layer and said cap layer to form sacrificial spacers on the sidewalls of said opening and expose said first interconnect.

19. The method of claim 15 wherein said sacrificial liner is comprised a material selected from the group consisting of: pore sealing material, carbon, and polynorbornene.

20. The method of claim 15 wherein said sacrificial liner is comprised of a material that can be removed by a heat treatment, light treatment, chemical reaction, or e-beam exposure.

21. A method of fabrication of liner gap in a semiconductor device; comprising the steps of:
   a) forming a first IMD layer over a structure: then
   b) forming a trench through said first IMD layer to expose the surface of said structure; said trench having sidewalls on said first IMD layer; then
   c) forming a insacrificial liner over at least the sidewalls of said trench; then
   d) forming a first interconnect filling said trench; then
   e) forming a first IMD cap layer over said first level interconnect; then
   f) forming a second IMD layer over said first IMD cap layer and first IMD layer; then
   g) forming an opening in said second IMD dielectric layer to expose said first IMD cap layer; then
   h) forming a sacrificial liner over the sidewalls of said opening; then
   i) forming a second level interconnect filling said opening;
      1) said second level interconnect comprised of a metal liner and a metal second level interconnect; then
   j) forming a second IMD cap layer over said second level interconnect and said second IMD layer; then
   k) forming a third IMD layer over said second IMD cap layer; then
   l) removing sacrificial liner to form air liner gaps; and removing said first sacrificial liner spaced to form air trench liner gaps.

22. The method of claim 21 wherein said first level interconnect comprised of a liner and a metal first level interconnect.

23. The method of claim 21 wherein said sacrificial liner is comprised of via trench spacers and line trench spacers.

24. The method of claim 21 wherein said sacrificial liner is formed by (a) etching said first IMD cap layer to expose said first interconnect, (b) forming a sacrificial layer over said opening, and (c) anisotropically etching said sacrificial liner and said first IMD cap layer to form sacrificial spacers on the sidewalls of said opening and expose said first interconnect.

25. The method of claim 21 wherein said sacrificial liner is formed by (a) etching said first IMD cap layer to expose said first interconnect, (b) forming a sacrificial layer using a selective deposition over the sidewalls of said first IMD cap layer and said second IMD dielectric layer, but not on said first interconnect.

26. The method of claim 21 wherein said sacrificial liner is comprised a material selected from the group consisting of: pore sealing material, carbon, and polynorbornene.

27. The method of claim 21 wherein said sacrificial liner is comprised of a material that can be removed by a heat treatment, light treatment, chemical reaction, or e-beam exposure.

28. The method of claim 15 wherein step (1) further includes removing said first sacrificial liner.

29. The method of claim 15 wherein after step (i) and before step (j) further includes:
   removing said first sacrificial liner.

* * * * *

UNITED STATES PATENT AND TRADEMARK OFFICE
CERTIFICATE OF CORRECTION

PATENT NO.         : 7,094,669 B2
APPLICATION NO. : 10/910499
DATED              : August 22, 2006
INVENTOR(S)       : Xiaomei Bu et al.

It is certified that error appears in the above-identified patent and that said Letters Patent is hereby corrected as shown below:

In issued Claim 15, Col. 9, line 14, subparagraph c), "wench" should read -- trench --.

In issued Claim 19, Col. 10, line 2, "comprised a material" should read -- comprised of a material --.

In issued Claim 21, Col. 10, line 14, subparagraph c), "insacrificial" should read -- first sacrificial --.

In issued Claim 21, Col. 10, line 33, subparagraph l), add -- said -- before "sacrificial layer".

In issued Claim 21, Col. 10, line 33, subparagraph l), remove "spaced" after "sacrificial liner".

Signed and Sealed this

Second Day of January, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,094,669 B2 | Page 1 of 1 |
| APPLICATION NO. | : 10/910499 | |
| DATED | : August 22, 2006 | |
| INVENTOR(S) | : Xiaomei Bu et al. | |

It is certified that error appears in the above-identified patent and that said Letters Patent is hereby corrected as shown below:

In the first page of the issued patent under Item (75) "Inventors", the 5th inventor's name "Yeon Kheng Lim" should read -- Yeow Kheng Lim --.

Signed and Sealed this

Twenty-third Day of January, 2007

JON W. DUDAS
*Director of the United States Patent and Trademark Office*